(12) United States Patent
Kondou

(10) Patent No.: US 6,628,683 B2
(45) Date of Patent: Sep. 30, 2003

(54) SEMICONDUCTOR LASER DEVICE AND METHOD OF CONTROLLING LIGHT AMOUNT OF SEMICONDUCTOR LASER

(75) Inventor: Kiyoshi Kondou, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 24 days.

(21) Appl. No.: 09/873,387

(22) Filed: Jun. 5, 2001

(65) Prior Publication Data

US 2001/0048697 A1 Dec. 6, 2001

(30) Foreign Application Priority Data

Jun. 6, 2000 (JP) ........................................ 2000-168571

(51) Int. Cl.[7] .............................................. H01S 3/00
(52) U.S. Cl. .......................................... 372/34; 372/36
(58) Field of Search ............................. 372/9, 34, 6, 36

(56) References Cited

U.S. PATENT DOCUMENTS

| 5,042,042 A | * | 8/1991 | Hori et al. ............. 372/29.021 |
| 5,181,127 A | * | 1/1993 | Ogino et al. ................. 358/296 |
| 6,014,526 A | * | 1/2000 | Allen ........................... 396/284 |
| 6,130,901 A | * | 10/2000 | Takamine et al. .............. 372/32 |
| 6,313,941 B1 | * | 11/2001 | Suzuki et al. ................. 359/337 |
| 2001/0017869 A1 | * | 8/2001 | Takata ....................... 372/29.02 |
| 2001/0033592 A1 | * | 10/2001 | Yamauchi et al. ............. 372/50 |
| 2002/0012369 A1 | * | 1/2002 | Nasu et al. .................... 372/36 |

FOREIGN PATENT DOCUMENTS

| JP | 5-32917 | 5/1993 | ............. H01S/3/18 |
| JP | 5-292259 | 11/1993 | ............. H04N/1/04 |

* cited by examiner

*Primary Examiner*—Paul Ip
*Assistant Examiner*—Dung Nguyen
(74) *Attorney, Agent, or Firm*—Sughrue Mion, PLLC

(57) ABSTRACT

In a semiconductor laser device, when a light beam is emitted from a semiconductor laser element in a state in which temperatures of the semiconductor laser element and a light detecting element are adjusted, effects of temperature characteristics of the semiconductor laser element and the light detecting element can be avoided, and a wavelength of the laser beam is stable. An amount of light of the light beam is detected at the light detecting element. On the basis of results of detection, the light amount of the light beam emitted from the semiconductor laser element is accurately controlled (APC).

20 Claims, 7 Drawing Sheets

SEMICONDUCTOR LASER DEVICE AND METHOD OF CONTROLLING LIGHT AMOUNT OF SEMICONDUCTOR LASER

BACKGROUND OF THE INVENTION

1. Field of the Invention

The present invention relates to a semiconductor laser device which can reduce variations in the wavelength of light emitted from a semiconductor laser element.

2. Description of the Related Art

As shown in FIG. 7, a conventional semiconductor laser device 100 is provided with a semiconductor laser element 102 and a light detecting element 104. The semiconductor laser element 102 emits a light beam L1 (hereinafter called "emitted light L1" when appropriate) toward a photosensitive material. The light detecting element 104 detects a light beam L2 (hereinafter called "detected light L2" when appropriate) which is emitted separately from the semiconductor laser element 102 in order to detect the amount of light of the emitted light L1.

At the semiconductor laser device 100, in order to suppress variations in the emitted light L1 which is emitted from the semiconductor laser element 102, so-called auto power control (APC) is utilized in which the driving circuit of the semiconductor laser element 102 is controlled such that the light amount of the detected light L2 detected at the light detecting element 104 is made constant.

Because the sensitivity of the light detecting element 104 varies due to the temperature thereof, the detected light L2 cannot be detected accurately, and accurate AP control cannot be carried out. Further, due to the variations in the temperature of the semiconductor laser element 102 itself, the wavelength of the detected light L2 emitted from the semiconductor laser element 102 varies, and accurate AP control cannot be carried out.

In order to overcome the aforementioned problems, in the conventional semiconductor laser device 100, the semiconductor laser element 102 and the light detecting element 104 are mounted to a thermally conductive material 108 which contacts a heat generating element 106, such that the respective temperatures of the semiconductor laser element 102 and the light detecting element 104 are regulated. However, the light detecting element 104 does not actually detect the output light L1 which is illuminated onto the photosensitive material, and detects the detected light L2 which is separate therefrom. Therefore, in this case as well, accurate AP control cannot be carried out.

SUMMARY OF THE INVENTION

In view of the aforementioned, an object of the present invention is to provide a semiconductor laser device which can carry out accurate AP control by directly detecting output light which is illuminated onto a photosensitive material.

A first aspect of the present invention is a semiconductor laser device comprising: an emitting device which emits a light beam which is illuminated onto a photosensitive material; a light-amount detecting device which detects an amount of light of the light beam which is illuminated onto the photosensitive material; a single or plural temperature-adjusting devices which adjust a temperature of the emitting device and a temperature of the light-amount detecting device to constant temperatures; and a control device which controls the amount of light of the light beam emitted from the emitting device, on the basis of the amount of light of the light beam detected by the light-amount detecting device.

Next, the operation of the semiconductor laser device of the first aspect of the present invention will be described.

The emitting device which emits a light beam is provided at the semiconductor laser device. The light beam emitted from the emitting device is illuminated onto a photosensitive material, and the photosensitive material is exposed. The amount of light of the light beam emitted from the emitting device is detected at the light-amount detecting device. On the basis of the amount of light of the light beam detected at the light-amount detecting device, the control device controls the amount of light of the light beam emitted from the emitting device (so-called AP control).

Here, the respective temperatures of the emitting device and the light-amount detecting device are adjusted to constant temperatures by the temperature-adjusting device. Thus, effects due to the temperature characteristics of the emitting device and the light-amount detecting device can be avoided. Namely, although the emitting ability of the emitting device and the detecting ability of the light-amount detecting device vary due to changes in temperature, the emitting ability and detecting ability can be kept constant by adjusting the temperatures of the emitting device and the light-amount detecting device to constant temperatures. Further, the wavelength of the light beam is stabilized. As a result, AP control can be carried out accurately.

In the present invention, the light beam which is illuminated onto the photosensitive material is directly detected by the light-amount detecting device. Thus, AP control can be carried out more accurately than in a case, such as that of the prior art, in which a light beam, which is other than the light beam illuminated onto the photosensitive material, is detected. Namely, in the present invention, in addition to avoiding effects due to temperature, AP control can be improved by directly detecting the light beam illuminated onto the photosensitive material.

In the semiconductor laser device of the first aspect of the present invention, preferably, the temperatures of the emitting device and the light-amount detecting device are adjusted by a single temperature-adjusting device.

In the semiconductor laser device of the first aspect of the present invention, preferably, the emitting device and the light-amount detecting device are mounted to a temperature-regulating block whose temperature is adjusted by a single temperature-adjusting device.

Next, the operation of the above-described semiconductor laser device will be described.

In the present invention, preferably, the emitting device and the light-amount detecting device are mounted to a temperature-regulating block whose temperature is adjusted by a single temperature-adjusting device. In this way, the respective temperatures of the emitting device and the light-amount detecting device can be adjusted.

Here, by providing a single temperature-adjusting device, the temperatures of the emitting device and the light-amount detecting device can be adjusted by a single temperature-adjusting device. As a result, as compared with a case in which plural temperature-adjusting devices are provided, no errors between respective temperature-adjusting devices arise, and adjustment of the temperatures of the emitting device and the light-amount detecting device is easy. Further, by using a single temperature-adjusting device, the number of parts and the number of assembly processes is reduced by that much, and fabrication of the semiconductor laser device is easy.

In the semiconductor laser device of the first aspect, more preferably, the light beam is reflected by a reflection coated optical member for beam reshaping and is detected by the light-amount detecting device.

Next, operation of the above-described semiconductor laser device will be described.

Preferably, the light beam is reflected by a reflection coated optical member for beam reshaping and is detected by the light-amount detecting device. Therefore, a reshaped light beam can be detected. Thus, because the light beam is detected in a reshaped state by the light-amount detecting device, the amount of light of the light beam can be detected accurately, and AP control can be carried out accurately.

An optical member where portion of the light beam passes and another portion of the light beam reflects may be provided in the semiconductor laser device of the first aspect of the present invention for illuminating the reflected light beam onto the photosensitive material and detecting the passed light beam through the optical member with the light-amount detecting device.

In the semiconductor laser device of the first aspect of the present invention, more preferably, a temperature-detecting device forming the temperature-adjusting device is disposed in a vicinity of the emitting device, and the temperature of the emitting device is detected by the temperature-detecting device.

Next, operation of this semiconductor laser device will be described.

Preferably, the temperature-detecting device forming the temperature-adjusting device is disposed in a vicinity of the emitting device. Thus, the temperature of the emitting device can be detected as accurately as possible. On the basis of the temperature detected by the temperature-detecting device, the temperature of the emitting device is adjusted to a constant temperature. Thus, the accuracy of adjustment of the temperature of the emitting device can be improved. As a result, the wavelength of the light beam emitted from the emitting device can be stabilized.

In the semiconductor laser device of the present invention, more preferably, a temperature-detecting device forming the temperature-adjusting device is disposed in a vicinity of the light-amount detecting device, and the temperature of the light-amount detecting device is detected by the temperature-detecting device.

Next, operation of this semiconductor laser device will be described.

Preferably, the temperature-detecting device forming the temperature-adjusting device is disposed in a vicinity of the light-amount detecting device. Thus, the temperature of the light-amount detecting device can be detected as accurately as possible. On the basis of the temperature detected by the temperature-detecting device, the temperature of the light-amount detecting device is adjusted to a constant temperature. Thus, the accuracy of adjustment of the temperature of the light-amount detecting device can be improved. As a result, the output stability of the light-amount detecting device can be improved.

More preferably, in the semiconductor laser device of the first aspect of the present invention, an angle of at least one of a reflecting surface of the optical member and a light receiving surface of the light-amount detecting device is adjusted such that the light beam is incident obliquely on the light receiving surface of the light-amount detecting device.

Next, operation of the above semiconductor laser device will be described.

In this preferable semiconductor laser device, an angle of at least one of a reflecting surface of the optical member and a light receiving surface of the light-amount detecting device is adjusted such that the light beam is incident obliquely on the light receiving surface of the light-amount detecting device. Thus, the light beam, which is reflected at the light receiving surface of the light-amount detecting device, follows the optical path of the light beam incident on the light receiving surface, and does not again reach the emitting device. As a result, a mode-hopping phenomenon, in which the light beam emitted from the emitting device is interfered with by the light beam reflected at the light receiving surface of the light-amount detecting device, can be prevented.

In the semiconductor laser device of the first aspect of the present invention, preferably, the control device includes a driving circuit substrate which is mounted to the temperature-regulating block and on which is mounted a driving element which drives the emitting device, and the driving element substantially contacts the temperature-regulating block.

Next, operation of the above-described semiconductor laser device will be described.

In this preferable semiconductor laser device, because the driving element which is mounted on the driving circuit substrate contacts the temperature-regulating block, the temperature of the driving element can be adjusted. As a result, effects of the temperature characteristic of the driving element can be avoided, and the amount of light of the light beam emitted from the emitting device can be stabilized. Further, the driving element contacts the temperature-regulating block. Thus, as compared with a case in which the driving element does not contact the temperature-regulating block and is connected by a harness, effects due to external disturbance of a harness can be avoided. Thus, the light amount of the light beam emitted from the emitting device can be stabilized.

The emitting device and the light-amount detecting device are mounted on the temperature-regulating block whose temperature is adjusted by the temperature-regulating device. The control device includes a driving circuit substrate, which has a driving element for driving the emitting device and a nonlinear circuit structural element for converting the input-output characteristics of the semiconductor laser device, is mounted on the temperature-regulating block. At least one of the driving element and the nonlinear circuit structural element is contacted by the temperature-regulating block and the temperature of the contacted element is adjusted.

Next, operation of the above-described semiconductor laser device will be described.

The temperature of at least one of the driving element and the nonlinear circuit structural element can be adjusted because one of the driving element and the nonlinear circuit structural element (e.g. a self-multiplication circuit or a log amplifier) both mounted on the driving circuit substrate is contacted by the temperature-regulating block. As a result, effects of at least one of the temperature characteristic of the driving element and the input-output characteristics of the nonlinear circuit structural element can be avoided, and the amount of light of the light beam emitted from the emitting device can be stabilized. Further, at least one of the driving element and the nonlinear circuit structural element contacts the temperature-regulating block. Thus, as compared with a case in which the driving element does not contact the temperature-regulating block and is connected by a harness, effects due to external disturbance of a harness can be avoided. Thus, the light amount of the light beam emitted from the emitting device can be stabilized.

A second aspect of the present invention is a method for controlling a light amount of a semiconductor laser beam, comprising the steps of (a) making a portion of an emitted light beam incident obliquely onto a light-amount detecting section, (b) directly detecting the portion of the emitted light beam at the light-amount detecting section, (c) adjusting a temperature of a light beam emitting section to a constant temperature, (d) adjusting a temperature of the light-amount detecting section to a constant temperature, and (e) adjusting a light amount of the light beam on the basis of a detected value of the light beam.

In accordance with the present invention, accurate AP control can be carried out by directly detecting output light illuminated onto a photosensitive material.

DESCRIPTION OF THE PREFERRED EMBODIMENTS

Figure 1:
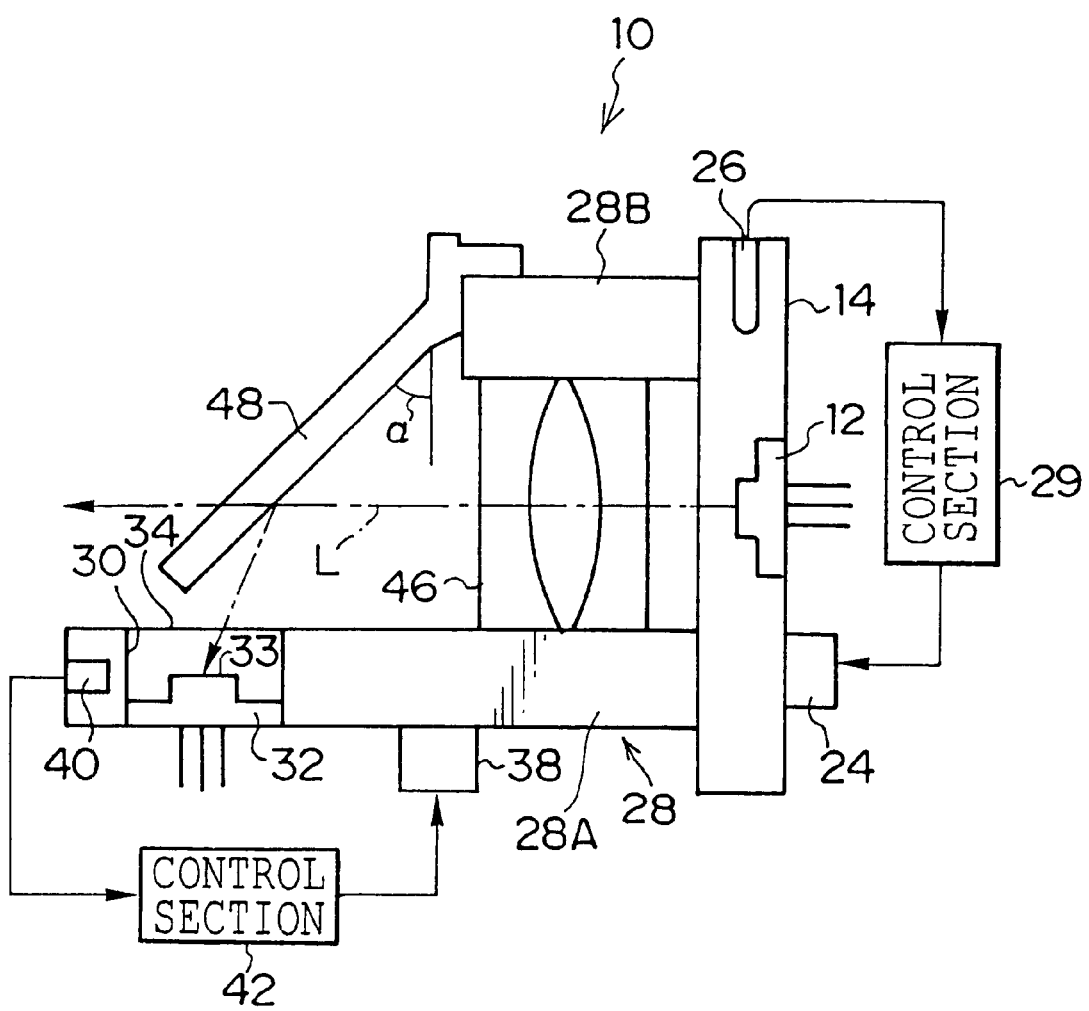
FIG. 1 is a partial side view showing a semiconductor laser device relating to a first embodiment of the present invention.
Figure 2:
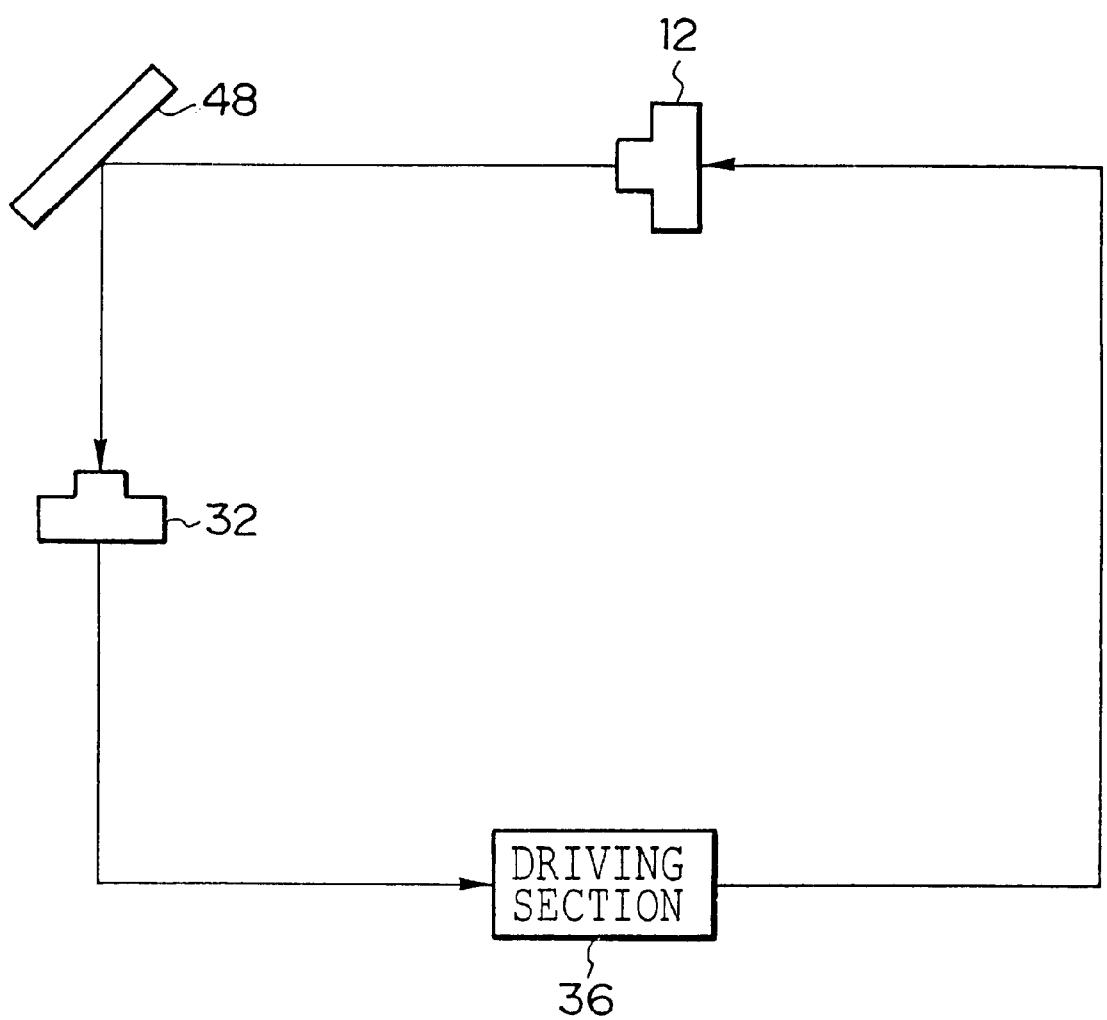
FIG. 2 is a control circuit diagram of the semiconductor laser device relating to the first embodiment of the present invention.

Hereinafter, a semiconductor laser device relating to a first embodiment of the present invention will be described with reference to the appended drawings. FIG. 1 is a partial side view of a semiconductor laser device of the present invention. FIG. 2 is a control circuit diagram of the semiconductor laser device.

A semiconductor laser device 10 of the present invention shown in FIG. 1 forms a light source section of an image exposing device (not shown). A light beam L which is emitted from the semiconductor laser device 10 passes through an optical system of optical members, a polygon mirror, an fθ lens, and the like, and thereafter, is illuminated onto a photosensitive material. Hereinafter, the structure of the semiconductor laser device 10 which is the present invention will be described.

The semiconductor laser device 10 is provided with a semiconductor laser element 12 which emits a light beam L. The semiconductor laser element 12 is mounted to a first temperature-regulating block 14 which is formed by a thermally conductive member.

Figure 5:
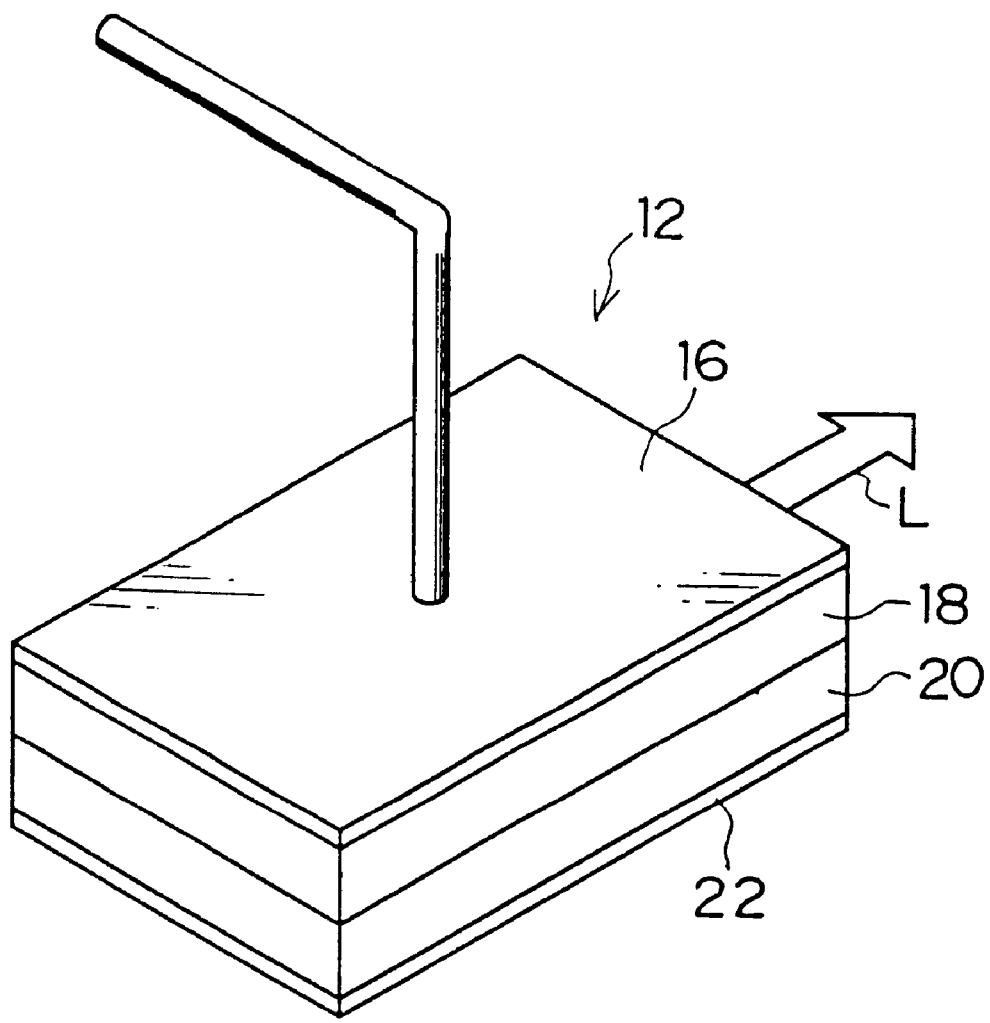
FIG. 5 is a structural view of a semiconductor laser element forming the semiconductor laser device of the present invention.

As shown in FIG. 5, the semiconductor laser element 12 is formed by a contact 16 for a positive electrode, a P layer 18, an N layer 20, and a contact 22 for a negative electrode, being layered. This is a known structure in which, by applying voltage between the contacts 16, 22, the light beam L is emitted.

A heat generating element 24, which regulates the temperature of the first temperature-regulating block 14, is mounted to the first temperature-regulating block 14. A temperature-detecting element 26, which detects the temperature of the first temperature-regulating block 14, is mounted to the upper end portion of the first temperature-regulating block 14.

The heat generating element 24 and the temperature-detecting element 26 are electrically connected via a control section 29. In this way, at the control section 29, the voltage applied to the heat generating element 24 is controlled, on the basis of the temperature of the first temperature-regulating block 14 detected by the temperature-detecting element 26, such that the temperature of the first regulating block 14 is a constant temperature.

A second temperature-regulating block 28, which is formed by a thermally conductive member, is mounted at the first temperature-regulating block 14 so as to be substantially perpendicular to the first temperature-regulating block 14. An opening 30 is formed in a lower portion 28A of the second temperature-regulating block 28. A light detecting element 32, which detects the light amount of the light beam L emitted from the semiconductor laser element 12, is provided within the opening 30. The angle of a light receiving surface 33 of the light detecting element 32 is adjusted appropriately by the way in which the light detecting element 32 is disposed.

As shown in FIG. 2, the semiconductor laser element 12 and the light detecting element 32 are connected electrically via a driving section 36 which is equipped with a driving circuit. In this way, the amount of light of the light beam L emitted from the semiconductor laser element 12 is controlled on the basis of the amount of light of the light beam L detected at the light detecting element 32, and the amount of light of the light beam L detected at the light detecting element 32 is made constant (AP control).

A heat generating element 38, which regulates the temperature of the second temperature-regulating block 28, is mounted to the lower portion 28A of the second temperature-regulating block 28. A temperature-detecting element 40, which detects the temperature of the second temperature-regulating block 28, is mounted to one end portion of the lower portion 28A of the second temperature-regulating block 28. The heat generating element 38 and the temperature-detecting element 40 are electrically connected via a control section 42. On the basis of the temperature of the second temperature-regulating block 28 detected by the temperature-detecting element 40, the control section 42 controls the voltage applied to the heat generating element 38 such that the temperature of the second temperature-regulating block 28 is a constant temperature.

An upper portion 28B of the second temperature-regulating block 28 is positioned in a vicinity of the upper end portion of the first temperature-regulating block 14. In this way, the upper portion 28B of the second temperature-regulating block 28 is positioned above the semiconductor laser element 12, and the lower portion 28A of the second temperature-regulating block 28 is positioned below the semiconductor laser element 12.

A collimator lens 46 is mounted between the upper portion 28B and the lower portion 28A of the second temperature-regulating block 28. Accordingly, the light beam L emitted from the semiconductor laser element 12 passes through the collimator lens 46.

An ND (neutral density) filter 48 (a neutral gray filter) is mounted as an optical member to the distal end portion of the upper portion 28B of the second temperature-regulating block 28. A mounting angle a of the ND filter 48 is appropriately adjusted by the way of mounting the ND filter 48. The light beam L which is reflected at the ND filter 48 is incident obliquely on the light receiving surface 33 of the light detecting element 32. Note that a half mirror may be used in place of the ND filter 48.

As other structures of the semiconductor laser device 10 are the same as those of a conventional semiconductor laser device, description thereof will be omitted.

Next, operation and the effects of the semiconductor laser device 10 relating to the present embodiment will be described.

As shown in FIG. 1, the heat generating element 24 generates heat, and the first temperature-regulating block 14 is heated to a predetermined temperature. Because the first temperature-regulating block 14 is formed of a thermally conductive material, the entire first temperature-regulating block 14 is heated. When the first temperature-regulating block 14 is heated, the temperature of the first temperature-regulating block 14 is detected by the temperature-detecting element 26. At this time, if the first temperature-regulating block 14 has not reached the predetermined temperature, voltage is applied to the heat generating element 24 by the control section 29, and the first temperature-regulating block 14 is heated until it reaches the predetermined temperature.

In the same way as with the first temperature-regulating block 14, the second temperature-regulating block 28 is heated by the heat generating element 38 until the second temperature-regulating block 28 reaches a predetermined temperature. Temperature control of the second temperature-regulating block 28 is carried out in the same way as temperature control of the first temperature-regulating block 14.

Next, as shown in FIGS. 1 and 5, the light beam L is emitted from the semiconductor laser element 12. A portion of this light beam L is reflected at the ND filter 48, passes through a cover glass 34, and is incident obliquely on the light receiving surface 33 of the light detecting element 32. The portion of the light beam L other than the light beam which is reflected at the ND filter 48, passes through the ND filter 48 and is illuminated via the optical system (not shown) onto the photosensitive material.

As shown in FIG. 2, when the light beam L reflected at the ND filter 48 is incident on the light detecting element 32, the amount of light of the light beam L is detected by the light detecting element 32. When the amount of light of the light beam L is detected by the light detecting element 32, the amount of light is transmitted to the driving section 36 as a detection signal. At the driving circuit of the driving section 36, on the basis of this detection signal, the amount of light of the light beam L which is emitted from the semiconductor laser element 12 is controlled (AP control) such that the amount of light of the light beam L detected by the light detecting element 32 is constant.

In the above-described AP control, the amount of light of the light beam L emitted from the semiconductor laser element 12 is detected by the light detecting element 32, and on the basis of the results of detection, the amount of light of the light beam L emitted from the semiconductor laser element 12 is controlled. However, generally, the semiconductor laser element 12 and the light detecting element 32 each have an intrinsic temperature characteristic. Thus, the light beam L emitting function and light beam L detecting function differ in accordance with variations in temperature. Namely, there is the problem that, due to variations in temperature, the wavelength of the light beam L emitted from the semiconductor laser element 12 varies, and the sensitivity to the amount of light of the light beam L at the light detecting element 32 varies. Accordingly, if the temperatures of the semiconductor laser element 12 and the light detecting element 32 are not maintained at constant temperatures, accurate AP control cannot be carried out.

Thus, as described above, by mounting the semiconductor laser element 12 and the light detecting element 32 to the first temperature-regulating block 14 and the second temperature-regulating block 28 which are adjusted to constant temperatures, the temperatures of the semiconductor laser element 12 and the light detecting element 32 can be adjusted to constant temperatures. In this way, effects on the semiconductor laser element 12 and the light detecting element 32 due to variations in temperature can be avoided. Namely, the wavelength of the light beam L emitted from the semiconductor laser element 12 can be made constant, and the sensitivity of the light detecting element 32 can be made constant. Thus, the above-described AP control can be carried out accurately.

In the present invention, a portion of the light beam L illuminated onto the photosensitive material is directly detected by the light detecting element 32. Thus, AP control can be carried out more accurately than in a case such as the conventional art shown in FIG. 7 in which AP control is carried out by detecting the light beam L2 which is separate from the light beam L1 which is illuminated onto the photosensitive material.

Figure 7:
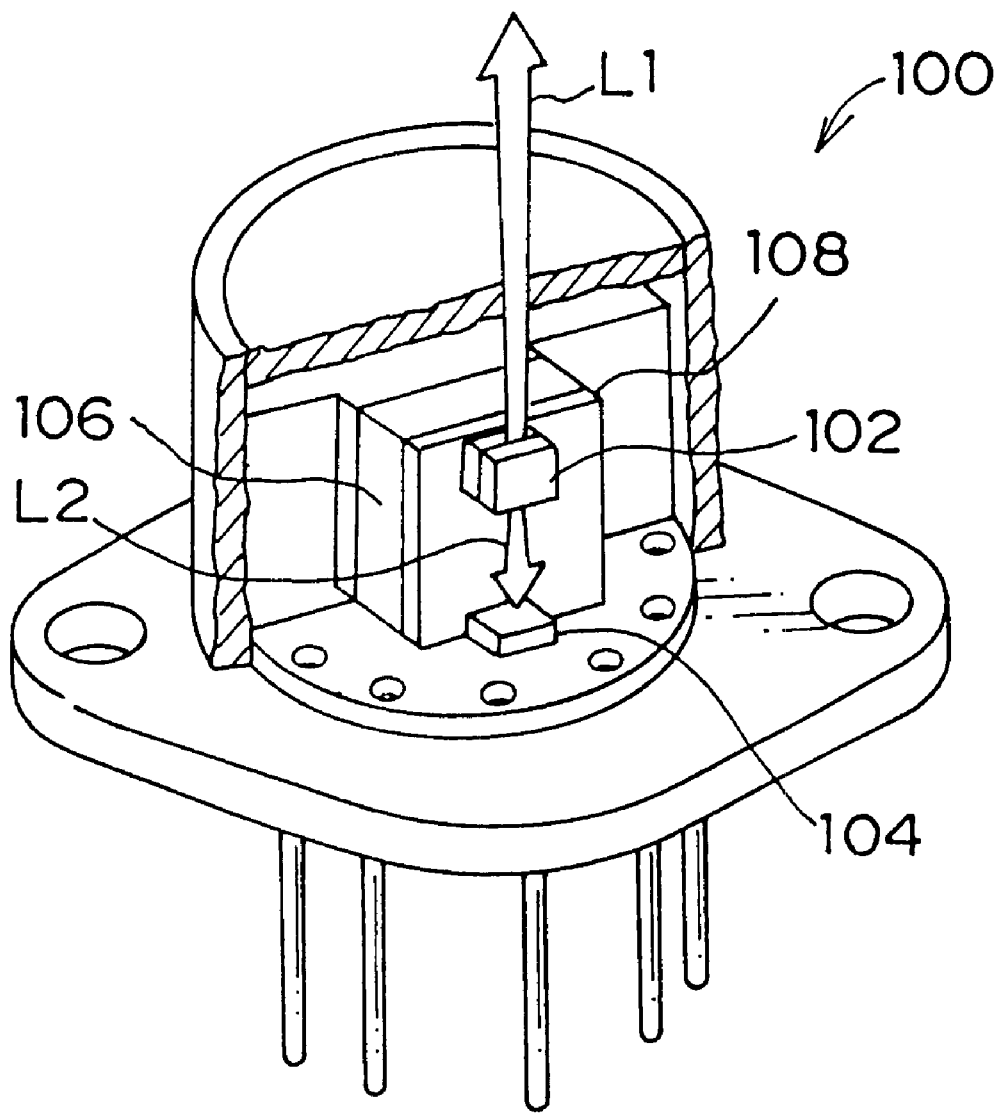
FIG. 7 is a partial perspective view showing a conventional semiconductor laser device.

Namely, in the conventional art shown in FIG. 7, among the light beams L1, L2 emitted from the semiconductor laser element 102, the light amount of the light beam L2, which is separate from the light beam L1 which is illuminated onto the photosensitive material, is detected by the light detecting element 104. The light amount of the light beam L1 emitted from the semiconductor laser element 102 is controlled on the basis of the results of detection. Thus, the light amount of the light beam L1 illuminated onto the photosensitive material cannot be accurately controlled.

However, in the present invention, the amount of light of the light beam L illuminated onto the photosensitive material is detected by the light detecting element 32, and the light amount of the light beam L emitted from the semiconductor laser element 12 is controlled on the basis of these results of detection. Thus, the amount of light of the light beam L emitted from the semiconductor laser element 12 can be controlled more accurately.

Moreover, in addition to the above-described effects, due to the light beam L being incident obliquely onto the light receiving surface 33 of the light detecting element 32, a portion of the light beam L incident on the light receiving surface 33 is reflected at a predetermined angle of reflection. Thus, this reflected light beam is not superposed on the light beam L incident on the light receiving surface 33. As a result, detection of the amount of light of the light beam L by the light detecting element 32 can be carried out accurately.

Next, a semiconductor laser device relating to a second embodiment of the present invention will be described.

The semiconductor laser device of the present embodiment differs from the structure of the semiconductor laser device 10 of the first embodiment in that, in the present embodiment, the semiconductor laser element and the light detecting element are mounted to a single temperature-regulating block and the temperatures thereof are regulated by a single heat generating element. Note that in the following description, description of structural members which are the same as those of the first embodiment is omitted.

Figure 3:
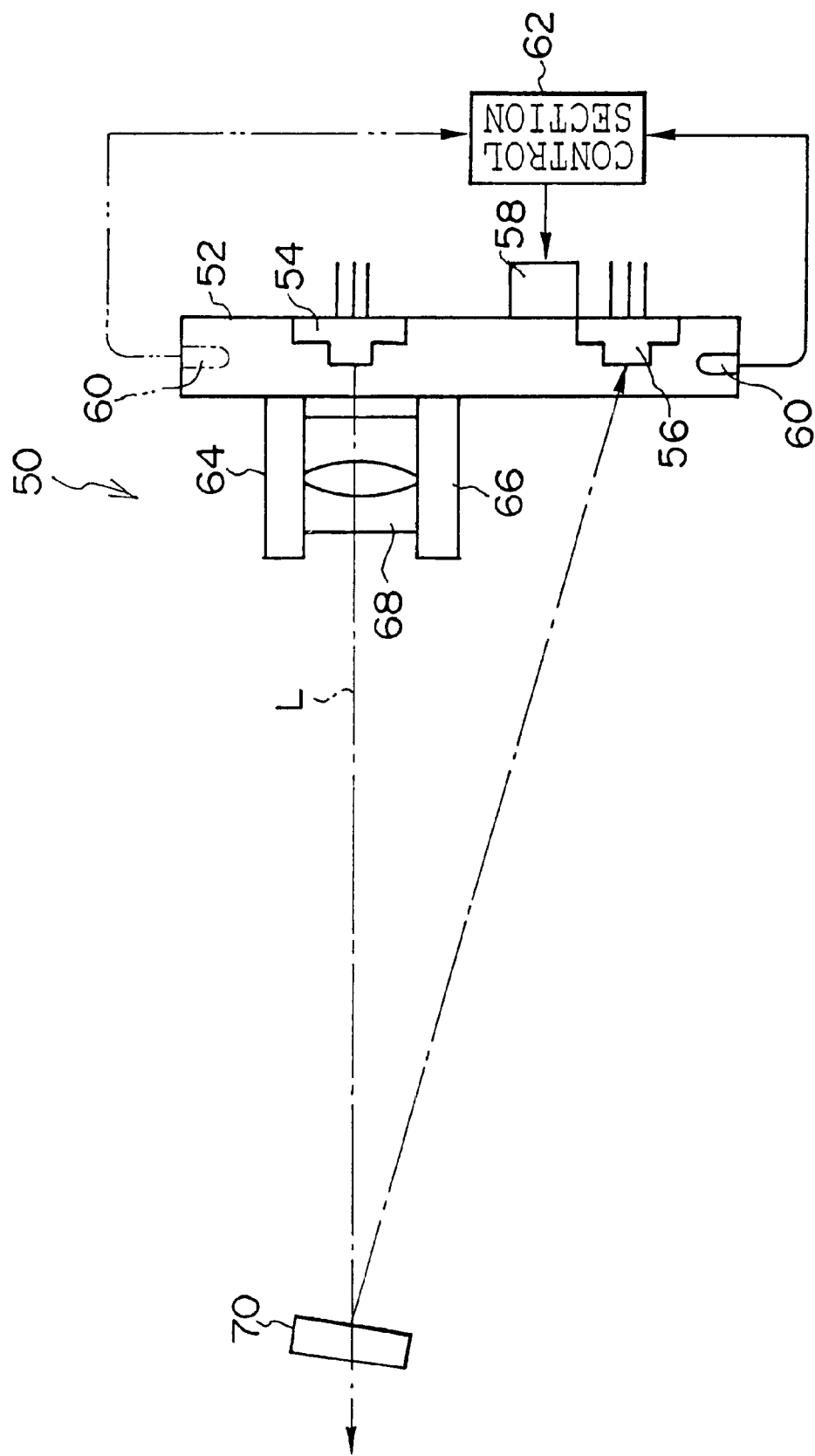
FIG. 3 is a partial side view showing a semiconductor laser device relating to a second embodiment of the present invention.

As shown in FIG. 3, a semiconductor laser device 50 is provided with one temperature-regulating block 52 which is formed from a thermally conductive member. A semiconductor laser element 54 and a light detecting element 56 are mounted to the temperature-regulating block 50. In the same way as in the first embodiment, the semiconductor laser element 54 and the light detecting element 56 are electrically connected via a driving section (not shown) which is equipped with a driving circuit.

A single heat generating element 58 which heats the temperature-regulating block 52 is mounted to the temperature-regulating block 52. Further, a single temperature-detecting element 60, which detects the temperature of the temperature-regulating block 52, is mounted to the lower end portion of the temperature-regulating block 52 which is in a vicinity of the light detecting element 56. Note that the heat generating element 58 and the temperature-detecting element 60 are electrically connected via a control section 62.

An upper portion supporting block 64 is mounted to a portion of the temperature-regulating block 52 positioned above the semiconductor laser element 54. A lower portion supporting block 66 is mounted to a portion of the temperature-regulating block 52 positioned below the semiconductor laser element 54. A collimator lens 68 is mounted between the upper portion supporting block 64 and the lower portion supporting block 66. In this way, the light beam L emitted from the semiconductor laser element 54 passes through the collimator lens 68.

A reflection-coated half mirror (an optical member) 70 is disposed on the optical path of the light beam L which is emitted from the semiconductor laser element 54. The reflecting surface of the half mirror 70 is curved, and the half mirror 70 functions to reshape the light beam L reflected by the half mirror 70. A reflection coated lens or the like may be used instead of the half mirror 70.

In accordance with the semiconductor laser device 50 of the present embodiment, the temperature-regulating block 52 is heated to a predetermined temperature by the single heat generating element 58. In the present embodiment, the temperature-regulating block 52 is heated by the single heat generating element 58, and the temperature of the temperature-regulating block 52 is detected by the single temperature-detecting element 60. Thus, as compared with a case in which a plurality of heat generating elements and temperature-detecting elements are used, errors between the heat generating elements and errors between the temperature-detecting elements do not arise, and it is easy to control the temperature of the temperature-regulating block 52.

In particular, because the temperature-detecting element 60 is provided in a vicinity of the light detecting element 56, the temperature of the light detecting element 56 can be detected accurately. Because the temperature of the temperature-regulating block 52 is adjusted on the basis of a temperature detected in the vicinity of the light detecting element 56, the accuracy of temperature adjustment of the light detecting element 56 can be improved. As a result, the stability of the output of the light detecting element 56 can be improved, and AP control can be carried out more accurately.

Further, because the light beam L received at the light detecting element 56 is reshaped by the half mirror 70, the amount of light of the light beam L detected at the light detecting element 56 can be detected accurately. As a result, AP control can be carried out more accurately.

In the present embodiment, one heat generating element 58 and one temperature-detecting element 60 are provided. Thus, as compared with a case in which a plurality of each of these elements is provided, the number of parts to be assembled and the number of assembly processes of the semiconductor laser device 50 can be reduced, and the semiconductor laser device 50 can be fabricated easily.

In the present embodiment, a case is described in which the temperature-detecting element 60 is mounted in a vicinity of the light detecting element 56. However, the present invention is not limited to the same.

For example, as shown by the two-dot chain line in FIG. 3, the temperature-detecting element 60 may be mounted to the upper end portion of the temperature-regulating block 52 which is in a vicinity of the semiconductor laser element 54. By mounting the temperature-detecting element 60 in a vicinity of the semiconductor laser element 54, the accuracy of temperature adjustment of the semiconductor laser element 54 can be improved, and the wavelength of the light beam L emitted from the semiconductor laser element 54 can be stabilized.

Next, a semiconductor laser device relating to a third embodiment of the present invention will be described.

Figure 4:
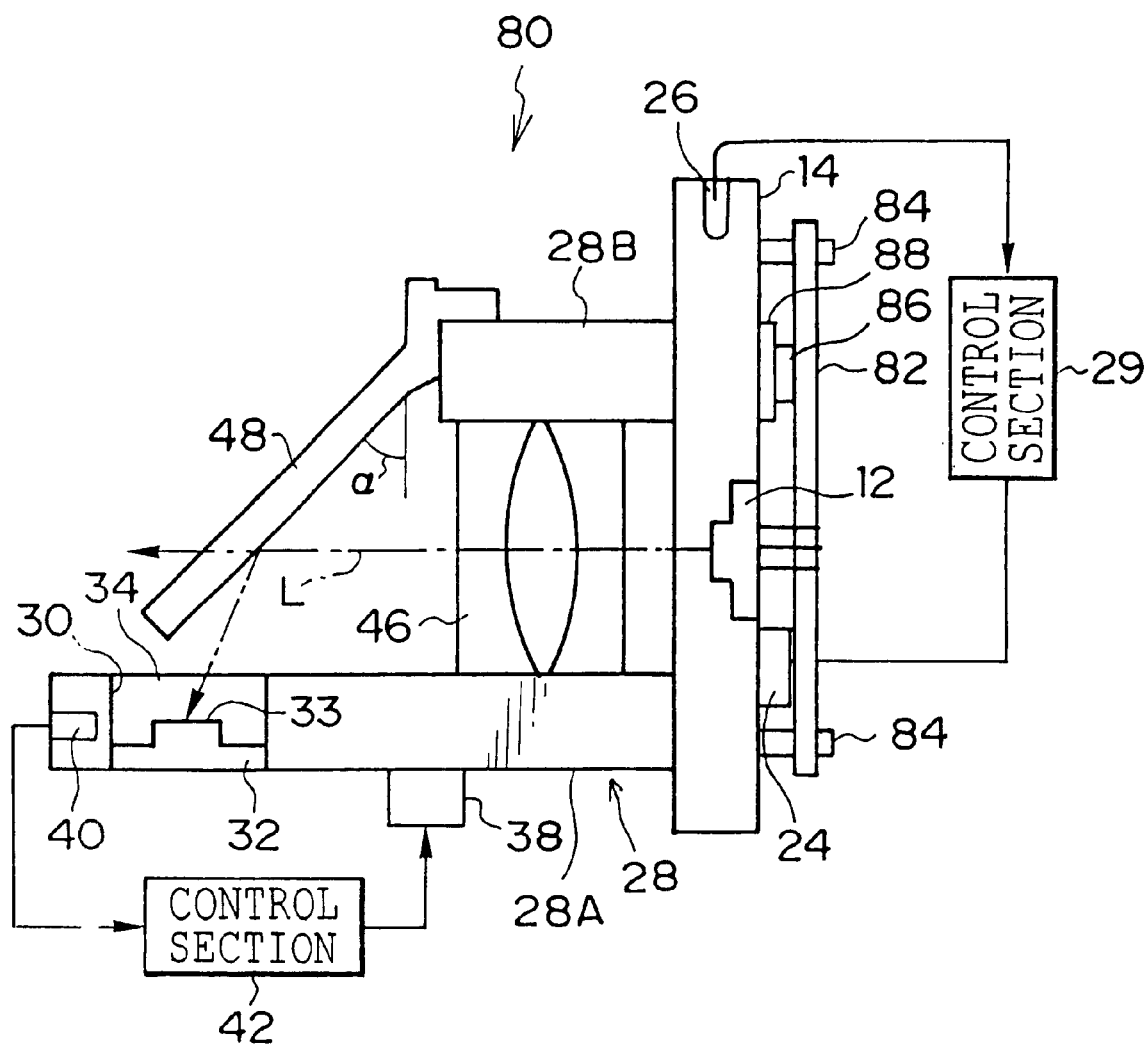
FIG. 4 is a partial side view showing a semiconductor laser device relating to a third embodiment of the present invention.

As shown in FIG. 4, a semiconductor laser device 80 of the present embodiment is basically structured similarly to the semiconductor laser device 10 of the first embodiment. However, at the semiconductor laser device 80, a driving circuit of the driving section 36 is provided on a driving circuit substrate 82, and the driving circuit substrate 82 is mounted to the first temperature-regulating block 14 by studs 84.

A driving element 86 of the driving circuit is substantially contacted by the first temperature-regulating block 14 via a thermally conductive sheet 88. Thus, the driving element 86 is heated via the thermally conductive sheet 88 from the first temperature-regulating block 14 which is heated by the heat generating element 24, and the temperature of the driving element 86 is regulated. As a result, effects of the temperature characteristic of the driving element 86 can be avoided, and the amount of light of the light beam L emitted from the semiconductor laser element 12 can be stabilized. Further, because no harness is used, effects due to the external disturbance of a harness can be avoided, and the amount of light of the light beam L emitted from the semiconductor laser element 12 can be stabilized.

Next, a semiconductor laser device relating to a forth embodiment of the present invention will be described.

Figure 6:
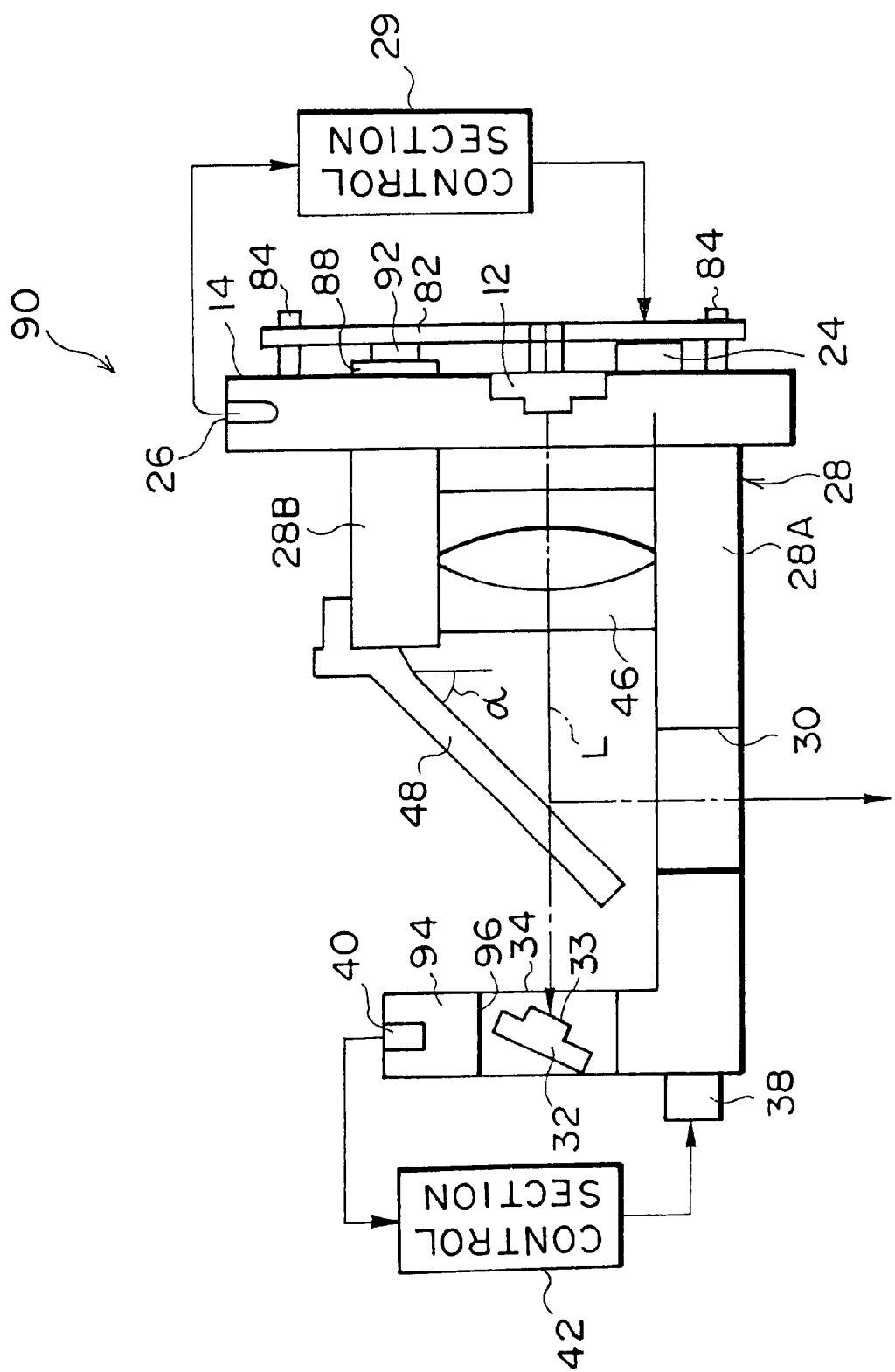
FIG. 6 is a partial side view showing a semiconductor laser device relating to a fourth embodiment of the present invention.

As shown in FIG. 6, a semiconductor laser device 90 of the present embodiment is basically structured similarly to the semiconductor laser device 80 of the third embodiment. However, both a driving element (not shown in FIG. 6) and a nonlinear circuit structural element 92 (e.g. self-multiplication circuit, log amplifier and the like) are provided on a driving circuit substrate 82, and the driving circuit substrate 82 is mounted to the first temperature-regulating block 14 by studs 84. Note that in the following description, description of structural members which are the same as those of the third embodiment is omitted.

In the semiconductor laser device 90, both of the driving element (not shown) and the nonlinear circuit structural element 92 are substantially contacted by the first temperature-regulating block 14 via a thermally conductive sheet 88. Thus, the driving element and the nonlinear circuit structural element 92 are heated via the thermally conductive sheet 88 from the first heat generating element 24, and the temperature of the driving element and the nonlinear circuit structural element 92 are regulated. As a result, effects of the temperature characteristic of the driving element and the nonlinear circuit structural element 92 can be avoided, and the amount of light of the light beam L emitted from the semiconductor laser element 12 can be stabilized. Further, because no harness is used, effects due to the external disturbance of a harness can be avoided, and the amount of light of the light beam L emitted from the semiconductor laser element 12 can be stabilized. Note that only one of the driving element and the nonlinear circuit structural element 92 may be substantially contacted by the first temperature-regulating block 14 via a thermally conductive sheet 88 while both the driving element and the nonlinear circuit structural element 92 are substantially contacted by the first temperature-regulating block 14 in the present embodiment.

A cross section of a lower portion 28A of a second temperature-regulating block 28 is L-shape formed in the semiconductor laser device 90 of the present embodiment. Another opening 96 is opened at a bent 94 formed at an end of the lower portion 28A, and a light detecting element 32 is provided at the opening 96. The light detecting element 32 detects the amount of light emitted from the semiconductor element 12 and passed through the ND filter 48. The opening 96 is equipped with a cover glass 34 in order to prevent dirt from adhering to the light receiving surface 33 of the light detecting element 32.

Note that the light detecting element 32 is not provided at the opening 30 and the opening 30 is a through hole for passing a light in the lower portion 28A in the fourth embodiment while the light detecting element 32 is provided at the opening 30 in the third embodiment.

The receiving light surface 33 of the light detecting element 32 is provided obliquely to the light of the light beam L. As a result, detection of the amount of light of the light beam L can be carried out correctly by the light detecting element 32 since the reflected light beam L at the light receiving surface 33 does not interfere with the incident light beam L on the light receiving surface 33.

The reflected light beam L at the ND filter 48 is passed through the opening 30 and illuminated onto the photosensitive material (not shown).

What is claimed is:

1. A semiconductor laser device comprising:
    an emitting section which emits a light beam which is illuminated onto a photosensitive material;
    a light-amount detecting section which detects an amount of light of the light beam which is illuminated onto the photosensitive material;
    at least one temperature-adjusting system which adjusts a temperature of the emitting section and a temperature of the light-amount detecting section to constant temperatures; and
    a control system which controls the amount of light of the light beam emitted from the emitting section, on the basis of the amount of light of the light beam detected by the light-amount detecting section.

2. The semiconductor laser device according to 1, wherein temperatures of the emitting section and the light-amount detecting section are adjusted by a common temperature-adjusting system.

3. A semiconductor laser device according to claim 1, further comprising a reflection coated optical member for beam reshaping which a first portion of the light beam passes through and a second portion of the light beam is reflected on wherein the first portion of the light beam passing through the optical member is illuminated onto the photosensitive material and the second portion of the light beam reflected on the optical member is detected by the light-amount detecting section.

4. A semiconductor laser device according to claim 1, wherein a temperature-detecting section, which forms the temperature-adjusting system, is disposed in a vicinity of the emitting section, and the temperature of the emitting section is detected by the temperature-detecting section.

5. A semiconductor laser device according to claim 1, wherein a temperature-detecting section, which forms the temperature-adjusting system, is disposed in a vicinity of the light-amount detecting section, and the temperature of the light-amount detecting section is detected by the temperature-detecting section.

6. A semiconductor laser device according to claim 2, wherein temperatures of the emitting section and the light-amount detecting section are adjusted by respectively mounting to a temperature-adjusting block whose temperature is adjusted by a single temperature-adjusting system.

7. A semiconductor laser device according to claim 2, further comprising a reflection coated optical member for beam reshaping which a first portion of the light beam passes through and a second portion of the light beam is reflected wherein the first portion of the light beam is illuminated onto the photosensitive material and the second portion of the light beam is detected by the light-amount detecting section.

8. A semiconductor laser device according to claim 2, wherein a temperature-detecting section, which forms the temperature-adjusting system, is disposed in a vicinity of the emitting section, and the temperature of the emitting section is detected by the temperature-detecting section.

9. The semiconductor laser device according to 2 further comprising an optical member for beam reshaping which a first portion of the light beam passes through and a second portion of the light beam is reflected on, wherein the second portion of the light beam passing through the optical member is illuminated onto the photosensitive material and the first portion of the light beam reflected on the optical member is detected by the light-amount detecting section.

10. A semiconductor laser device according to claim 3, wherein an angle of at least one of a reflecting surface of the optical member and a light receiving surface of the light-amount detecting section is adjusted such that the light beam is incident obliquely on the light receiving surface of the light-amount detecting section.

11. A semiconductor laser device according to claim 6, wherein the control system includes a driving circuit substrate which is mounted to the temperature-regulating block and on which is mounted a driving element which drives the emitting section, and the driving element substantially contacts the temperature-regulating block.

12. The semiconductor laser device according to 6, wherein the emitting section and the light-amount detecting section are mounted to the temperature-regulating block whose temperature is adjusted by the temperature control section, and the control system includes a driving circuit substrate which includes a driving element for driving the emitting section and a nonlinear circuit structural element for converting input-output characteristics of the semiconductor laser device, the driving circuit substrate is mounted to the temperature-regulating block, and at least one of the driving element and the nonlinear circuit structural element substantially contacts the temperature-regulating block for adjusting temperature of at least one of the driving element and the nonlinear circuit structural element.

13. A semiconductor laser device according to claim 7, wherein a temperature-detecting section, which forms the temperature-adjusting system, is disposed in a vicinity of the light-amount detecting section, and the temperature of the light-amount detecting section is detected by the temperature-detecting section.

14. A semiconductor laser device according to claim 9, wherein an angle of at least one of a reflecting surface of the optical member and a light receiving surface of the light-amount detecting section is adjusted such that the light beam is incident obliquely on the light receiving surface of the light-amount detecting section.

15. A semiconductor laser device comprising:
   an emitting section which emits a light beam which is illuminated onto a photosensitive material;
   a light-amount detecting section which detects an amount of light of the light beam which is illuminated onto the photosensitive material;
   a single temperature-adjusting system which adjusts a temperature of the emitting section and a temperature of the light-amount detecting section to constant temperatures; and
   a control system which controls the amount of light of the light beam emitted from the emitting section, on the basis of the amount of light of the light beam detected by the light-amount detecting section.

16. A semiconductor laser device according to claim 15, wherein the light beam is reflected by a reflection coated optical member for beam reshaping and is detected by the light-amount detecting section.

17. A semiconductor laser device according to claim 15, wherein a temperature-detecting section, which forms the temperature-adjusting system, is disposed in a vicinity of the emitting section, and the temperature of the emitting section is detected by the temperature-detecting section.

18. A semiconductor laser device according to claim 15, wherein a temperature-detecting section, which forms the temperature-adjusting system, is disposed in a vicinity of the light-amount detecting section, and the temperature of the light-amount detecting section is detected by the temperature-detecting section.

19. A method for controlling a light amount of a semiconductor laser beam, comprising the steps of:
   (a) making a portion of an emitted light beam incident obliquely onto a light amount detecting section;
   (b) directly detecting the portion of the emitted light beam at the light-amount detecting section;
   (c) adjusting a temperature of a light beam emitting section to a constant temperature;
   (d) adjusting a temperature of the light-amount detecting section to a constant temperature; and
   (e) adjusting a light amount of the light beam on the basis of a detected value of the light beam.

20. A method for controlling a light amount of a semiconductor laser beam according to claim 19, further comprising the step of: making the light beam incident onto the light-amount detecting section by refracting the light beam.

* * * * *